(12) United States Patent
Chung

(10) Patent No.: US 7,535,700 B2
(45) Date of Patent: May 19, 2009

(54) PLASMA DISPLAY DEVICE

(75) Inventor: Moo-il Chung, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/929,568

(22) Filed: Oct. 30, 2007

(65) Prior Publication Data

US 2008/0112117 A1  May 15, 2008

(30) Foreign Application Priority Data

Nov. 9, 2006   (KR) .................. 10-2006-0110480

(51) Int. Cl.
*H05K 5/02* (2006.01)
(52) U.S. Cl. .................... 361/681; 345/60; 313/584; 710/62
(58) Field of Classification Search .............. 345/41, 345/60, 64; 705/15; 219/388; 439/66; 349/129; 710/2, 62; 313/582, 584; 361/679–687, 361/724–727
See application file for complete search history.

(56) References Cited

U.S. PATENT DOCUMENTS

| | | | |
|---|---|---|---|
| 2007/0085763 A1* | 4/2007 | Jeong | 345/60 |
| 2008/0101002 A1* | 5/2008 | Kim et al. | 361/681 |
| 2008/0186662 A1* | 8/2008 | Lee | 361/681 |

FOREIGN PATENT DOCUMENTS

KR   10-2006-0086212 A   7/2006

* cited by examiner

*Primary Examiner*—Hung V Duong
(74) *Attorney, Agent, or Firm*—Christie, Parker & Hale, LLP

(57) ABSTRACT

A display device is provided including a display panel for displaying an image, the display panel having substrates and electrodes located between the substrates. The display device also includes a chassis base supporting the display panel and a plurality of printed circuit board assemblies mounted in the chassis base for driving the display panel. One of the printed circuit board assemblies is an address buffer board assembly driving an address electrode, the address buffer board assembly including a flexible printed circuit connected to the address electrode. The flexible printed circuit has a terminal surface corresponding to a width of a terminal drawn from the address buffer board assembly.

10 Claims, 5 Drawing Sheets

PLASMA DISPLAY DEVICE

CROSS-REFERENCE TO RELATED APPLICATION

This application claims priority to and the benefit of Korean Patent Application No. 2006-0110480 filed on Nov. 9, 2006, in the Korean Intellectual Property Office, the entire content of which is incorporated herein by reference.

BACKGROUND OF THE INVENTION

1. Field of the Invention

The present invention relates to a plasma display device, and more particularly, to a plasma display device having an address buffer board assembly and a flexible printed circuit that are directly connected to each other.

2. Description of Related Art

Generally, a plasma display device includes a plasma display panel (PDP) for displaying an image created by exciting phosphors using vacuum ultraviolet (VUV) rays emitted from plasma generated by gas discharge. The PDP also includes a chassis base for supporting the plasma display panel, and a plurality of printed circuit board assemblies mounted on the chassis base.

The printed circuit board assemblies are provided to drive electrodes. More specifically, the printed circuit board assemblies include a sustain board assembly connected to and controlling a sustain electrode, a scan board assembly connected to and controlling a scan electrode, an address buffer board assembly connected to and controlling an address electrode. The printed circuit board assemblies also include an image process/control board assembly generating a control signal for driving the address electrode, and a control signal for driving the sustain and scan electrodes by receiving an external image signal and applying the control signals to the corresponding board assemblies, and an electric power source board assembly providing electric power for driving the board assemblies.

A flexible printed circuit connects the address buffer board assembly to the address electrode and includes a driver integrated circuit package such as a tape carrier package (TCP). The driver integrated circuit package is assembled by installing a driver integrated circuit generating an address pulse for the address electrode on the flexible printed circuit. The driver integrated circuit package is located on a longitudinal side of the plasma display panel, and is connected to the address buffer board assembly in a U-shape.

In a conventional plasma display device, the address buffer board assembly and the flexible printed circuit are connected to each other by a connector. For example, a female connector attached on a terminal of the address buffer board is engaged with a male connector attached on the terminal of the flexible printed circuit.

However, as plasma display devices become larger and have higher definition, problems may arise when using a connector to connect the address buffer board to the flexible printed circuit. More specifically, the number of connecting portions necessary for the connectors increases and high impedance is induced from the high output connecting portion of the connectors, thereby increasing electromagnetic interference (EMI).

Furthermore, in a conventional plasma display device as the connector is interposed between the address buffer board assembly and the flexible printed circuit, a connection defect may occur at the connecting portion between the address buffer board assembly and the flexible printed circuit. In addition, there is a need to provide a dust cover to prevent a short circuit caused by foreign objects from occurring.

SUMMARY OF THE INVENTION

A display device is provided including a display panel for displaying an image, the display panel having substrates and electrodes located between the substrates. The display device also includes a chassis base supporting the display panel and a plurality of printed circuit board assemblies mounted in the chassis base for driving the display panel. One of the printed circuit board assemblies is an address buffer board assembly driving an address electrode, the address buffer board assembly including a flexible printed circuit connected to the address electrode. The flexible printed circuit has a terminal surface corresponding to a width of a terminal drawn from the address buffer board assembly. The address buffer board assembly may be a rigid flexible buffer board.

The address buffer board assembly may also include a low output terminal transmitting a low output logic signal and a high output terminal having a terminal surface larger than the low output terminal portion. The terminal of the address buffer board assembly and a terminal of the flexible printed circuit may be stacked at different heights. One of the terminals of the address buffer board assembly may be a ground terminal.

The terminal of the flexible printed circuit may extend integrally with a terminal drawn from the address buffer board assembly and the flexible printed circuit may be a tape carrier package. An anisotropic conductive film may be interposed between the terminal of the flexible printed circuit and the terminal of the address electrode drawn out of a dielectric layer of the display panel to electrically connect the terminal of the flexible printed circuit and the terminal of the address electrode. The display device may be a plasma display device.

Also provided is a method of connecting a printed circuit board assembly of a display device as described above to a flexible printed circuit The method includes locating an electrode on the display panel, the electrode having an electrode terminal at one end, connecting a flexible printed circuit to the electrode such that a flexible printed circuit terminal extends integrally with a printed circuited board assembly terminal, and locating an anisotropic conductive film between the flexible printed circuit terminal and the electrode terminal to electrically connect the flexible printed circuit terminal to the electrode terminal.

DETAILED DESCRIPTION

Figure 1:
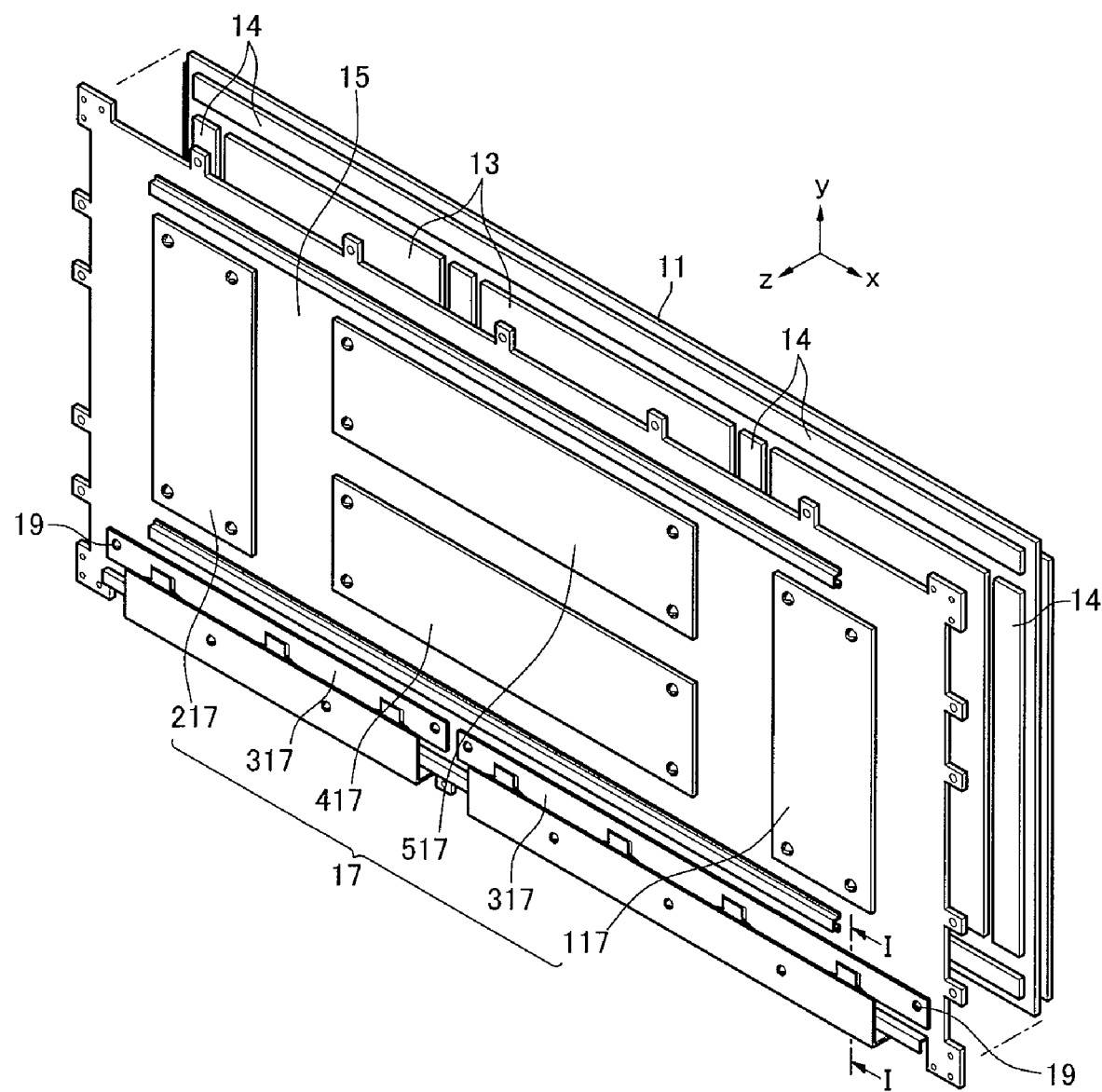
FIG. 1 is a schematic exploded perspective view of a plasma display device according to an embodiment of the present invention.
Figure 2:
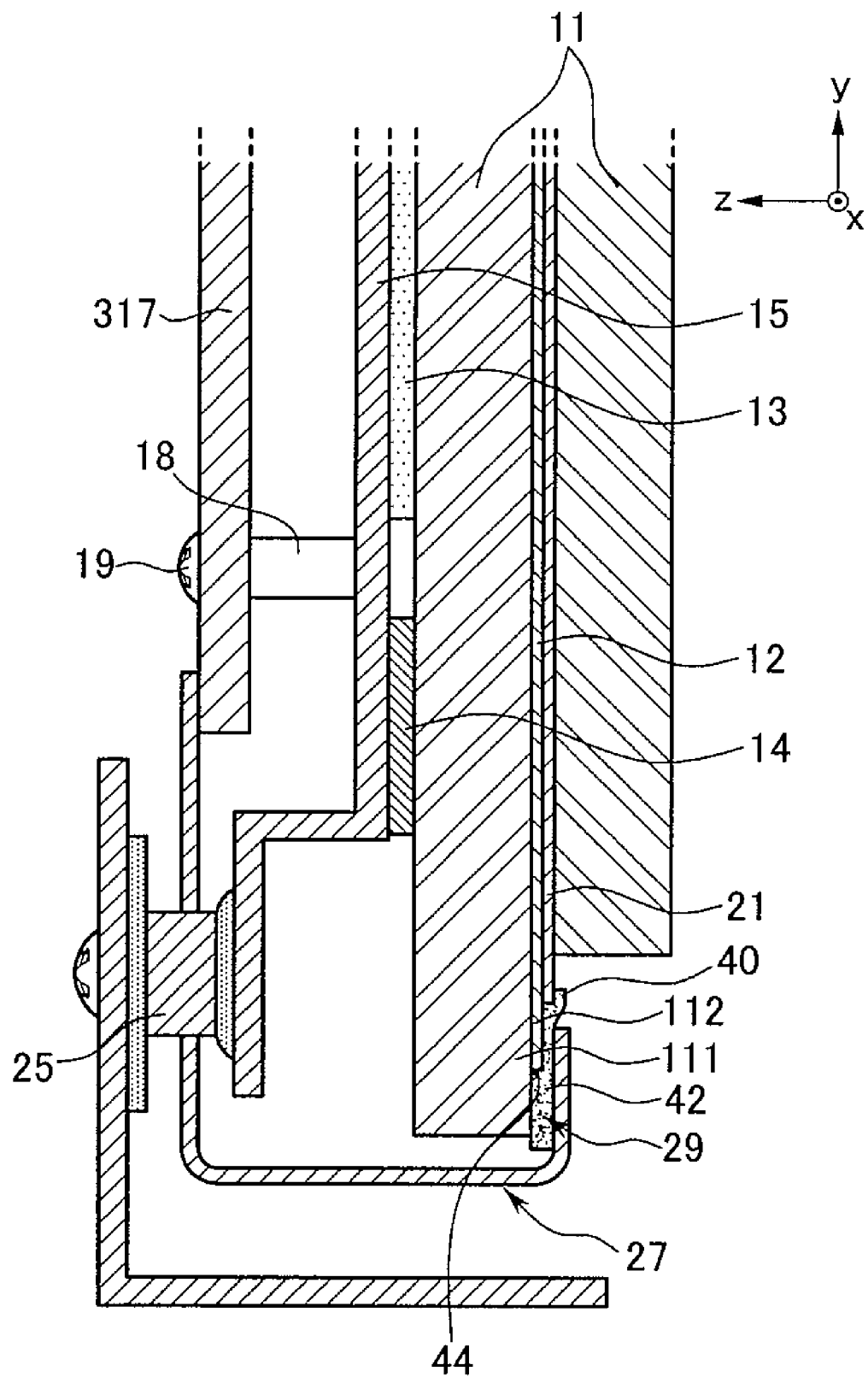
FIG. 2 is a sectional view taken along line I-I of FIG. 1.

As shown in FIGS. 1 and 2, a plasma display device of an embodiment of the present invention includes a PDP 11 for displaying an image using gas discharge, a heat dissipation sheet 13, a chassis base 15, and a plurality of printed circuit board assemblies 17.

The plasma display panel 11 includes two glass substrates facing each other and spaced from each other to form a discharge space. Since the plasma display panel 11 has weak mechanical strength against external impact, the chassis base 15 may be formed from a material having higher mechanical strength than the glass substrates, such as a metal, to support the plasma display panel 11. Additionally, the chassis base provides a space to hold the printed circuit board assemblies 17, and functions as a heat sink and as a ground for EMI.

The heat dissipation sheets 13 are provided on a rear surface of the plasma display panel 11 to dissipate heat generated from the plasma display panel 11 due to gas discharge.

The chassis base 15 is attached to a rear surface of the plasma display panel 11 using, for example, double-sided tape 14 with the heat dissipation sheets 13 interposed between the chassis base 15 and the plasma display panel 11.

The printed circuit board assembles 17 are mounted on the rear surface of the chassis base 15 and are electrically connected to the plasma display panel 11 to drive the plasma display panel 11.

The plasma display panel 11 includes electrodes for gas discharge. FIG. 2 shows an exemplary address electrode 12 of the plasma display panel connected to an address buffer board assembly 317 among the printed circuit board assemblies 17.

The plurality of printed circuit board assemblies 17 are located on a respective plurality of bosses 18 and fixed thereto by set screws 19. The printed circuit board assemblies 17 are formed compartmentally to perform respective functions for driving the plasma display panel 11.

For example, the printed circuit board assemblies 17 include a sustain board assembly 117 controlling a sustain electrode (not shown), a scan board assembly 217 controlling a scan electrode (not shown), an address buffer board assembly 317 controlling an address electrode, an image process/control board assembly 417 generating a control signal for driving the address electrode and a control signal for driving the sustain and scan electrodes by receiving an external image signal and applying the control signals to the corresponding board assemblies, and an electric power source assembly 517 providing electric power for driving the board assemblies.

Figure 3:
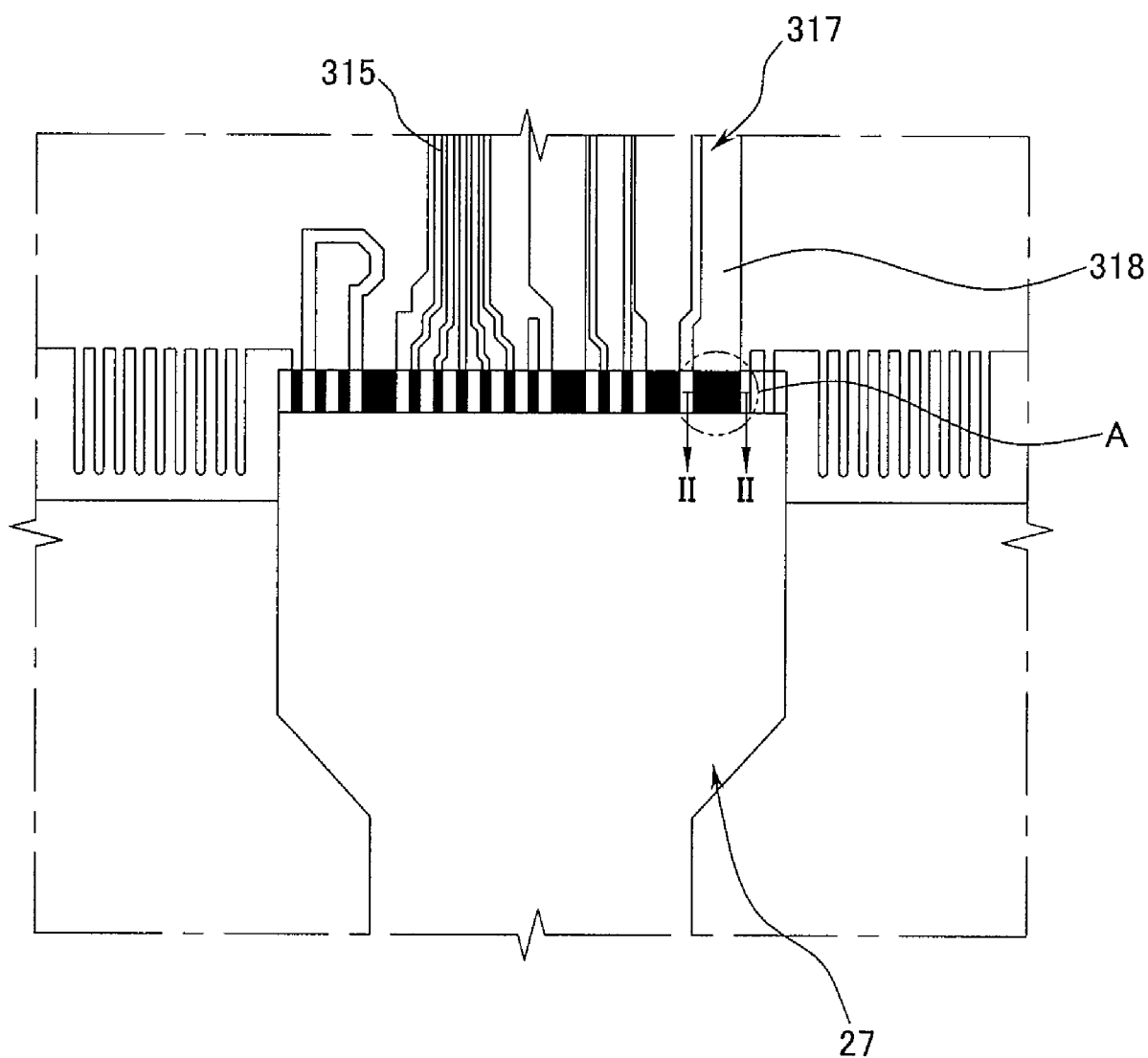
FIG. 3 is a top view illustrating a connection structure between an address buffer board assembly and a flexible printed circuit of the plasma display device of FIG. 1.
Figure 4:
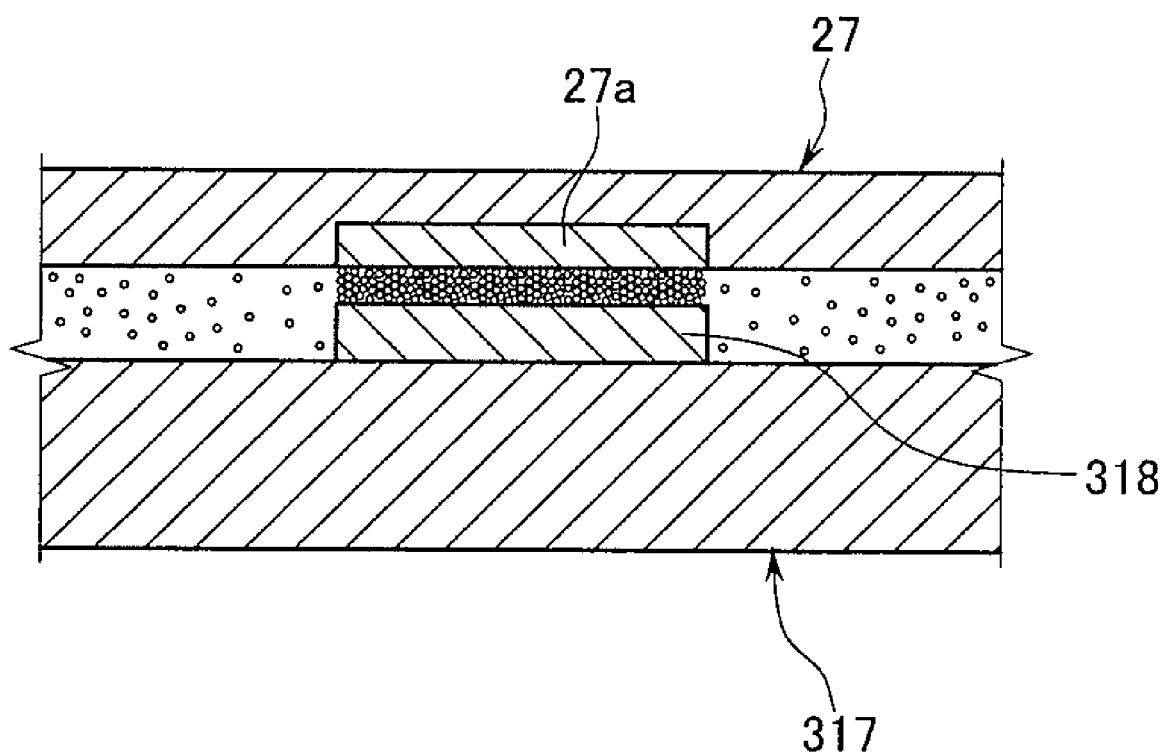
FIG. 4 is a sectional view taken along line II-II of FIG. 3.

FIG. 3 is a top view illustrating a connection structure between the address buffer board assembly and the flexible printed circuit. As shown in FIGS. 1 through 3, the address buffer board assembly 317 is connected to the address electrode 12 through a flexible printed circuit 27. The flexible printed circuit 27 has a terminal surface generally corresponding to a width of a terminal extending from the address buffer board assembly 317. In other words, the terminal of the flexible printed circuit 27 extends integrally with the terminal extending from the address buffer board assembly 317, thereby significantly reducing the likelihood of a connection defect between the flexible printed circuit 27 and the address buffer board assembly 317, as well as reducing the generation of EMI, and preventing a short circuit caused by the inflow of foreign objects.

The address buffer board assembly 317 may include a low output terminal portion 315 transmitting a low output logic signal and a high output terminal portion 318 having an area larger than that of the low-output terminal portion. As the size and definition of the panel increase, the output of the signal transmitted from the address buffer board assembly 317 to the electrode increases.

In the prior art, in order to input the output signal generated from an address buffer board assembly, a plurality of connector pins are short-circuited into a single pin unit and then connected to the high-output terminal portion of the address buffer board assembly. Therefore, the plasma display device of the prior art transmits the high output signal within a narrow region such as the pin and thus generates high impedance at a connecting portion of the high output terminal, thereby increasing the radiation of EMI. According to test data, it was noted that 54.2 dB EMI, higher than the FFC standard (40 dB), is radiated at a low band of 30 MHz when a connecting portion between the address buffer board assembly and the flexible printed board of a 50-inch high definition (HD) panel was tested.

However, in the plasma display device of the present embodiment, the high output terminal portion for transmitting the high output signal from the address buffer board assembly 317 is designed to be wide (region A of FIG. 3) and the terminal of the flexible printed circuit 27 is formed to correspond to the high output terminal portion 318. Therefore, the plasma display device of this embodiment has low impedance at the high output terminal portion 318 even when a high output signal is transmitted, thereby reducing EMI radiation.

Since the terminal of the address buffer board assembly 317 is directly connected to the flexible printed circuit 27, the terminal of the address buffer board assembly 317 and the terminal of the flexible printed circuit 27 are stacked at different heights. Thus, a relatively large number of signals may be transmitted within a limited space. One of the terminals of the address buffer board assembly 317 may be formed as a ground terminal. The address buffer board assembly 317 may be a rigid flexible board.

The flexible printed circuit 27 may be a TCP mounting a driver integrated circuit 25 generating a control signal applied to the address electrode 12 to which the flexible printed circuit is connected.

Figure 5:
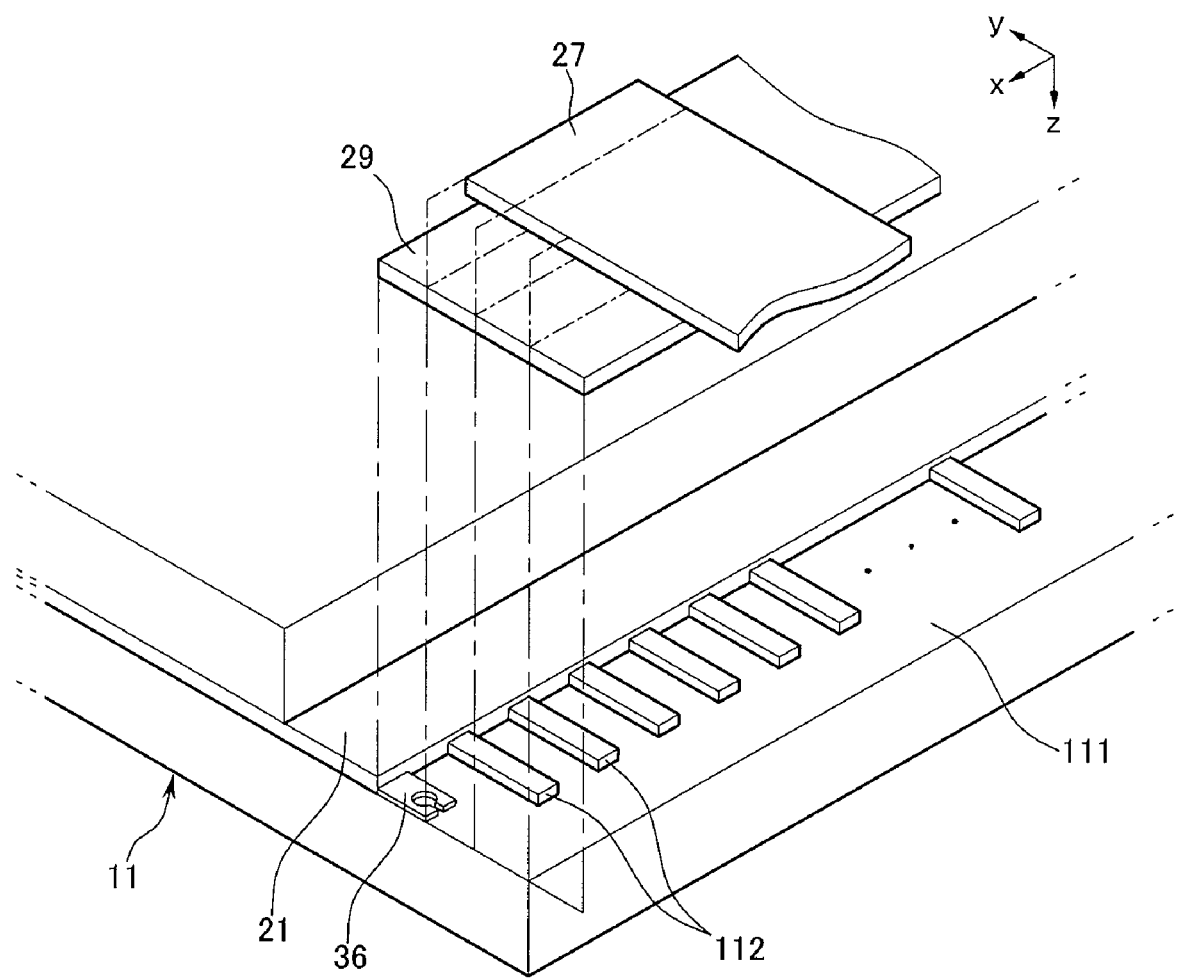
FIG. 5 is a perspective view illustrating a connection structure between a plasma display panel and a flexible printed circuit of FIG. 1.

FIG. 5 is a perspective view illustrating a connection structure between the plasma display panel and the flexible printed circuit. Referring to FIGS. 1 through 5, an anisotropic conductive film 29 may be interposed between the terminal of the flexible printed circuit 27 and the terminal of the address electrode 12 extending from a dielectric layer of the PDP 11, thereby electrically connecting the terminals to each other.

The anisotropic conductive film 29 is attached to and covers the electrode terminals 112 and is also attached to and covers a substrate 111 located around ends of the electrode terminals 112. The anisotropic conductive film 29 covers the electrode terminals 112 and an alignment mark 36 provided adjacent one of the electrode terminals 112 arranged at a side of the substrate 111.

Referring to FIG. 5, a first end 40 of the anisotropic conductive film 29 is aligned with an end of a dielectric layer 21 covering the address electrodes 12. The anisotropic conductive film extends such that it covers each electrode terminal 112 extending from the dielectric layer. The terminal of the flexible printed circuit 27 is located on the anisotropic conductive film 29 facing the electrode terminal 112 such that the flexible printed circuit 27 contacts the electrode terminals 112 with the anisotropic conductive film 29 located therebetween. Accordingly, an end 42 of the anisotropic conductive film 29 adjacent to an end of the substrate 111 is aligned with the ends 44 of the electrode terminals 112.

In one exemplary embodiment, conductive members contained in the anisotropic conductive film 29 electrically connect the electrode terminals 112 of the plasma display panel 11 to the electrode of the flexible printed circuit 27. More specifically, a polymer material contained in the anisotropic conductive film 29 is hardened by heat, thereby physically attaching the substrate 111 of the plasma display panel 11 to the flexible printed circuit 27.

According to embodiments of the plasma display panel of the present invention, even when a high output signal is transmitted due to increased sizes and resolutions of plasma display panels, impedance at the high output terminal is low, and EMI radiation is reduced. Furthermore, since the terminal of the flexible printed circuit extends integrally with the terminal drawn from the address buffer board assembly, the likelihood of a connection defect between the flexible printed circuit and the address buffer board assembly is significantly reduced.

In addition, since the terminal of the flexible printed circuit is assembled simultaneously with the assembly of the address buffer board assembly terminal followed by the terminals being mounted inside the circuit, a short circuit between the terminals caused by foreign objects may be prevented.

Although exemplary embodiments of the present invention have been shown and described, it will be appreciated by those skilled in the art that changes may be made in this embodiment without departing from the principles and spirit of the invention, the scope of which is defined in the claims and their equivalents.

What is claimed is:

1. A display device comprising:
    a display panel for displaying an image, the display panel having substrates and electrodes between the substrates;
    a chassis base supporting the display panel; and
    a plurality of printed circuit board assemblies mounted in the chassis base for driving the display panel;
    wherein one of the plurality of printed circuit board assemblies is an address buffer board assembly driving an address electrode;
    wherein the address buffer board assembly includes a flexible printed circuit connected to the address electrode; and
    wherein the flexible printed circuit has a terminal having a width corresponding to a width of a terminal extending from the address buffer board assembly.

2. The display device of claim 1, wherein the address buffer board assembly further comprises:
    a low output terminal transmitting a low output logic signal; and
    a high output terminal having a terminal surface larger than a terminal surface of the low output terminal.

3. The display device of claim 2, wherein the terminal of the address buffer board assembly and the terminal of the flexible printed circuit are stacked at different heights.

4. The display device of claim 3, wherein one of the terminals of the address buffer board assembly is a ground terminal.

5. The display device of claim 2, wherein the terminal of the flexible printed circuit extends integrally with a terminal extending from the address buffer board assembly.

6. The display device of claim 5, wherein the flexible printed circuit is a tape carrier package.

7. The display device of claim 6, wherein an anisotropic conductive film is between the terminal of the flexible printed circuit and a terminal of the address electrode extending from a dielectric layer of the display panel to electrically connect the terminal of the flexible printed circuit and the terminal of the address electrode.

8. The display device of claim 1, wherein the address buffer board assembly is a rigid flexible buffer board.

9. The display device of claim 1, wherein the display device is a plasma display device.

10. A method of connecting a printed circuit board assembly of a display device to a flexible printed circuit, the display device including:
    a display panel for displaying an image, the display panel having substrates and electrodes between the substrates;
    a chassis base supporting the display panel; and
    a plurality of printed circuit board assemblies mounted in the chassis base for driving the display panel; the method comprising:
    locating an electrode on the display panel, the electrode having an electrode terminal at one end;
    connecting a flexible printed circuit to the electrode such that a flexible printed circuit terminal extends integrally with a printed circuit board assembly terminal; and
    locating an anisotropic conductive film between the flexible printed circuit terminal and the electrode terminal to electrically connect the flexible printed circuit terminal to the electrode terminal.

* * * * *

UNITED STATES PATENT AND TRADEMARK OFFICE
CERTIFICATE OF CORRECTION

| | | |
|---|---|---|
| PATENT NO. | : 7,535,700 B2 | Page 1 of 1 |
| APPLICATION NO. | : 11/929568 | |
| DATED | : May 19, 2009 | |
| INVENTOR(S) | : Moo-il Chung | |

It is certified that error appears in the above-identified patent and that said Letters Patent is hereby corrected as shown below:

Column 6, Claim 3, line 3    After "the" insert -- low output -- and after "terminal" delete "of"

Column 6, Claim 3, line 4    Delete "the address buffer board assembly" and
Before "terminal"
Insert -- high output -- and
After "terminal" delete "of the"

Column 6, Claim 3, line 5    Delete "of the flexible printed circuit." and
Delete "at different heights"

Column 6, Claim 4, lines 6 and 7    After "the" delete "terminals of the address buffer board assembly" and
Insert -- low output terminal and the high output terminal --

Signed and Sealed this
Fifteenth Day of November, 2011

David J. Kappos
*Director of the United States Patent and Trademark Office*